United States Patent
Cablao et al.

(10) Patent No.: US 8,026,129 B2
(45) Date of Patent: Sep. 27, 2011

(54) STACKED INTEGRATED CIRCUITS PACKAGE SYSTEM WITH PASSIVE COMPONENTS

(75) Inventors: Philip Lyndon Cablao, Singapore (SG); Dario S. Filoteo, Jr., Singapore (SG); Leo A. Merilo, Singapore (SG); Emmanuel Espiritu, Singapore (SG); Rachel Layda Abinan, Singapore (SG); Allan Ilagan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 135 days.

(21) Appl. No.: 11/276,682

(22) Filed: Mar. 10, 2006

(65) Prior Publication Data

US 2007/0210432 A1  Sep. 13, 2007

(51) Int. Cl.
*H01L 21/00* (2006.01)
(52) U.S. Cl. ........ 438/109; 438/106; 438/125; 438/126; 438/127; 257/686; 257/777; 257/E21.001; 257/E23.085; 257/E25.021
(58) Field of Classification Search .............. 438/109; 257/777, 700, E23.085, E25.021, E21.001
See application file for complete search history.

(56) References Cited

U.S. PATENT DOCUMENTS

| | | | |
|---|---|---|---|
| 5,805,422 A | 9/1998 | Otake et al. | |
| 6,117,797 A * | 9/2000 | Hembree | 438/759 |
| 6,583,503 B2 | 6/2003 | Akram et al. | |
| 6,713,860 B2 * | 3/2004 | Li | 257/700 |
| 6,781,222 B2 | 8/2004 | Wu et al. | |
| 6,933,597 B1 | 8/2005 | Poddar et al. | |
| 6,943,294 B2 | 9/2005 | Kang et al. | |
| 7,015,575 B2 * | 3/2006 | Suenaga et al. | 257/700 |
| 7,141,874 B2 * | 11/2006 | Nakatani | 257/700 |
| 7,242,081 B1 * | 7/2007 | Lee | 257/686 |
| 2002/0027773 A1 * | 3/2002 | Davidson | 361/763 |
| 2002/0140085 A1 * | 10/2002 | Lee et al. | 257/724 |
| 2003/0090883 A1 * | 5/2003 | Asahi et al. | 361/761 |
| 2005/0184372 A1 * | 8/2005 | Asahi et al. | 257/678 |
| 2006/0255449 A1 * | 11/2006 | Lee et al. | 257/698 |

* cited by examiner

*Primary Examiner* — Angel Roman
(74) *Attorney, Agent, or Firm* — Mikio Ishimaru

(57) ABSTRACT

A stacked integrated circuit package system is provided forming a first stack layer having a first integrated circuit die on a first substrate, forming a second stack layer having a second integrated circuit die on a second substrate, and mechanically and electrically connecting a spacer layer having a first passive component between the second stack layer and the first stack layer.

20 Claims, 3 Drawing Sheets

STACKED INTEGRATED CIRCUITS PACKAGE SYSTEM WITH PASSIVE COMPONENTS

TECHNICAL FIELD

The present invention relates generally to integrated circuit packages and more particularly to integrated circuit package-in-package.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large scale integration have underscored the need for back mixed-signal solutions. Numerous technologies have been developed to meet these requirements. Some of the research and development strategies focus on new technologies while others focus on improving the mature package technologies.

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Numerous integrated circuit designs are aimed for mixed-signal designs by incorporating analog functions. One of the major challenges in the creation of analog processing circuitry (using digital processing procedures and equipment) is that a number of the components that are used for analog circuitry are large in size and are therefore not readily integrated into integrated circuits. The main components that offer a challenge in this respect are capacitors, resistors, and inductors, since these components are, for typical analog processing circuits, are of considerable size.

In response to the demands for improved package performance and analog circuitry integration, other approaches pack discrete analog devices into the integrated circuit package. This mixed-signal integrated circuit technology or system in package (SIP) is another approach to reduce the space required for the integrated circuits content. Stacking integrated circuits is another approach to pack more integrated circuit content while minimizing the dimensions of the package. But these packaging types have some problems requiring additional process steps and physical space.

Thus, a need still remains for the stacked integrated circuit package system providing low cost manufacturing as well as improved performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package system including forming a first stack layer having a first integrated circuit die on a first substrate, forming a second stack layer having a second integrated circuit die on a second substrate, and mechanically and electrically connecting a spacer layer having a first passive component between the second stack layer and the first stack layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
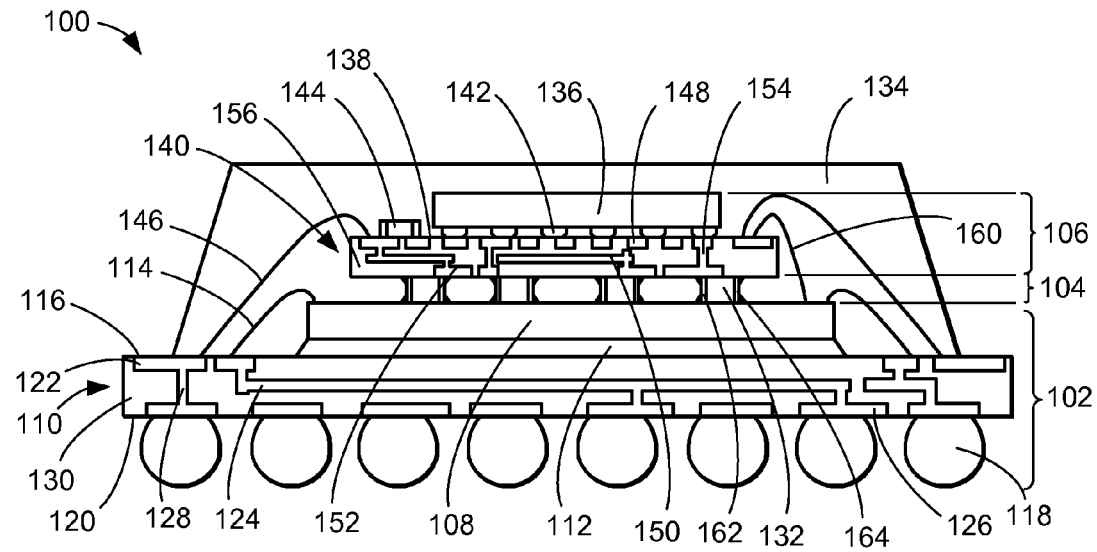
FIG. 1 is a cross-sectional view of a first stacked integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a first stacked integrated circuit package system 100 in an embodiment of the present invention. The first stacked integrated circuit package system 100 includes a first stack layer 102, a spacer layer 104, and a second stack layer 106.

The first stack layer 102 includes a first integrated circuit die 108 attached to a first substrate 110 with an adhesive 112, such as a die-attach adhesive. First interconnects 114, such as bond wires, connect between the first integrated circuit die 108 and a first top side 116 of the first substrate 110. External interconnects 118 attach on a first bottom side 120 of the first substrate 110 for connections to the next system level (not shown), such as printed circuit board.

The first substrate 110 has a first top metal layer 122, a first middle metal layer 124, and a first bottom metal layer 126 with first electrical vias 128 connecting these layers at predetermined locations and configurations. The external interconnects 118 attach to the first bottom metal layer 126. The first interconnects 114 attach to the first top metal layer 122. The first top metal layer 122, the first middle metal layer 124, and the first bottom metal layer 126 may be used for signal routing throughout the first substrate 110. The first substrate 110 also includes a first insulation 130 providing mechanical support as well as electrically isolating traces in the first top metal layer 122 from each other, traces in the first middle metal layer 124 from each other, traces in the first bottom metal layer 126 from each other as well as the first top metal layer 122, the first middle metal layer 124, and the first bottom metal layer 126 from each other. The first insulation 130 also provides mechanical support and electrically isolates the first electrical vias 128 from each other.

The spacer layer 104 includes first passive components 132, such as pre-packaged resistors, capacitors, or inductors sometimes referred to as 0201, 0402, or 0603. The first passive components 132 are pre-packaged in packages having a predetermined thickness, length, and width so that the thicknesses of a number of equal thickness packages form spacer structures separating the first stack layer 102 and the second stack layer 106 by the predetermined thickness. The first passive components 132 are on the first integrated circuit die 108 without impeding the first interconnects 114 while spaced such that a package encapsulation 134 fills the space between the first passive components 132.

Some or all of the first passive components 132 may be electrically connected to the first integrated circuit die 108. Some or all of the first passive components 132 may also electrically, as well as mechanically, connect to the second stack layer 106. A matrix of interconnects and distribution may be formed with first terminals 162 and second terminals 164, both of the first passive components 132. It is understood that the first passive components 132 may have different number of terminals.

Signals may flow between the second stack layer 106 through the first terminals 162 to the second terminals 164 or vice versa such that the first passive components 132 serves as interconnects and distribution layer for a second substrate 140. The first passive components 132 serving as the distribution layer for the second substrate 140 may be mechanically attached to the first integrated circuit die 108.

Signals may also flow between bond pads (not shown) of the first integrated circuit die 108 through the first terminals 162 to the second terminals 164 or vice versa such that the first passive components 132 serves as interconnects and distribution layer for the first integrated circuit die 108. The first passive components 132 serving as the distribution layer for the first integrated circuit die 108 may be mechanically attached to the second substrate 140.

Signals may further flow between bond pads of the first integrated circuit die 108 and the second substrate 140 through the first terminals 162 to the second terminals 164 or vice versa such that the first passive components 132 serves as interconnects and distribution layer between the first integrated circuit die 108 and the second substrate 140. The first passive components 132 serving as the distribution layer between the first integrated circuit die 108 and the second substrate 140 may be mechanically attached to the second substrate 140 and the first integrated circuit die 108, respectively. For example, the first terminals 162 electrically attach to the second substrate 140 and mechanically attach to the first integrated circuit die 108 while the second terminals 164 mechanically attach to the second substrate 140 and electrically attach to the first integrated circuit die 108, or vice versa.

The first passive components 132 may form various circuits and functions, such as mode selection, voltage dividers, noise filters, high pass filters, or low pass filters. These circuits may provide signal conditioning for signals through the second substrate 140, through the first integrated circuit die 108, or between the first stack layer 102 and the second stack layer 106. Each of the first passive components 132 may form the interconnection or distribution functions as well as serve as a spacer. The first passive components 132 or a portion may also form a circuit network.

The second stack layer 106 stacks on the spacer layer 104 and over the first stack layer 102. The second stack layer 106 includes a second integrated circuit die 136, such as a land grid array device or a flip chip, connected to a second top side 138 of the second substrate 140 with second interconnects 142, such as solder bumps or solder balls. Second passive components 144, such as resistors, capacitors, or inductors, also attach to the second top side 138. Third interconnects 146, such as bond wires, connect between the second substrate 140 and the first substrate 110.

The second substrate 140 has a second top metal layer 148, a second middle metal layer 150, and a second bottom metal layer 152 with second electrical vias 154 connecting these layers at predetermined locations and configurations. The first passive components 132 attach to the second bottom metal layer 152. The second interconnects 142 attach to the second top metal layer 148. The second top metal layer 148, the second middle metal layer 150, and the second bottom metal layer 152 may be used for signal routing throughout the second substrate 140 along with the first passive components 132.

The second substrate 140 also includes a second insulation 156 providing mechanical support as well as electrically isolating traces in the second top metal layer 148 from each other, traces in the second middle metal layer 150 from each other, traces in the second bottom metal layer 152 from each other as well as the second top metal layer 148, the second middle metal layer 150, and the second bottom metal layer 152 from each other. The second insulation 156 also provides mechanical support and electrically isolates the second electrical vias 154 from each other. Fourth interconnects 160, such as bond wires, connect between the second top side 138 and the first integrated circuit die 108.

The package encapsulation 134 covers the first integrated circuit die 108, the first interconnects 114, the first passive components 132, the second stack layer 106, and the third interconnects 146 forming the first stacked integrated circuit package system 100. The first stack layer 102, the first passive components 132, and the second stack layer 106 may be tested to ensure known good devices (KGD) prior to assembly of the first stacked integrated circuit package system 100.

For illustrative purpose, the first substrate 110 and the second substrate 140 are shown as having three layers, although it is understood that the number of metal layers may differ. Also for illustrative purpose, the first stacked integrated circuit package system 100 is shown as having two stack layers, although it is understood that the number of stack layers may differ. Further for illustrative purpose, the spacer layer 104 is shown to have the first passive components 132, although it is understood that the spacer layer 104 may include other spacer structures and device types.

Figure 2:
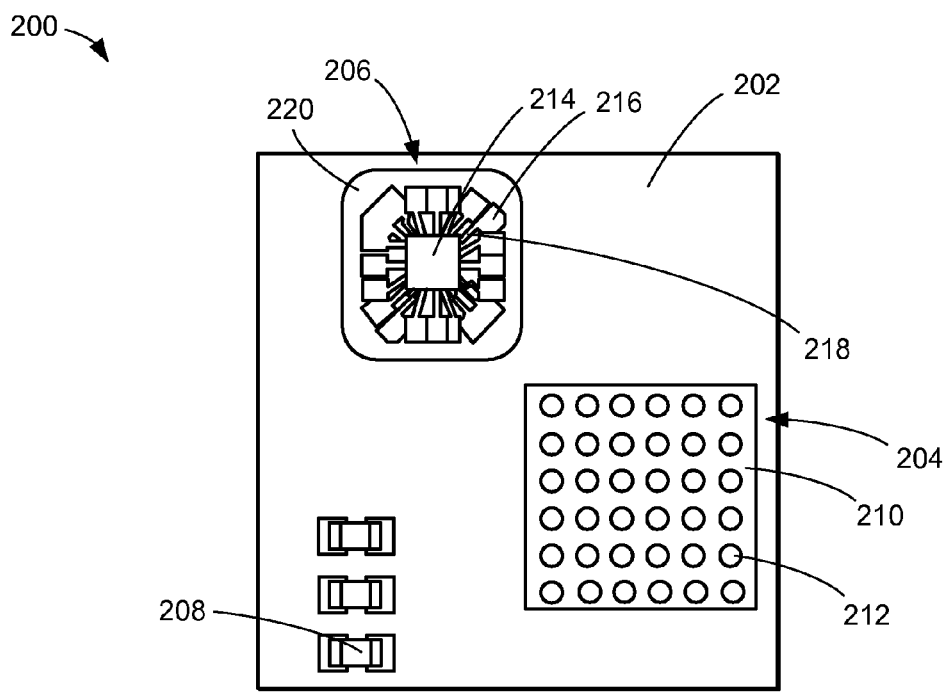
FIG. 2 is a plan view of a second stack layer.

Referring now to FIG. 2, therein is shown a plan view of a second stack layer 200. The second stack layer 200 may represent the second stack layer for all the embodiments described. The plan view depicts a substrate 202 having a first integrated circuit device 204, such as a land grid array device, a ball grid array device, or a flip chip, a second integrated circuit device 206, such as an integrated circuit package with a glob top, and passive components 208 provide thereon.

The first integrated circuit device 204 also includes a first integrated circuit die 210 having first interconnects 212, such as solder bumps or solder balls, in a grid array configuration and may be encapsulated or not. The second integrated circuit device 206 includes a second integrated circuit die 214 connected to leads 216 with second interconnects 218, such as bond wires. A glob top 220 covers the second integrated circuit die 214, the second interconnects 218, and the leads 216.

Figure 3:
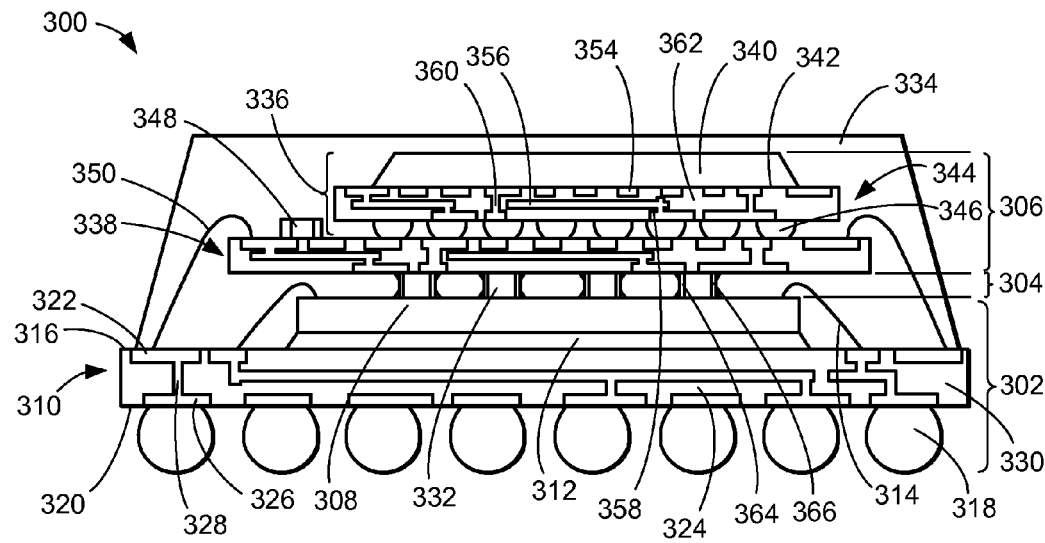
FIG. 3 is a cross-sectional view of a second stacked integrated circuit package system in an alternative embodiment of the present invention.

Referring now to FIG. 3, therein is shown a cross-sectional view of a second stacked integrated circuit package system 300 in an alternative embodiment of the present invention. The second stacked integrated circuit package system 300 includes a first stack layer 302, a spacer layer 304, and a second stack layer 306. The second stack layer 200 of FIG. 2 may represent the second stack layer 306.

The first stack layer 302 includes a first integrated circuit die 308 attached to a first substrate 310 with an adhesive 312, such as a die-attach adhesive. First interconnects 314, such as bond wires, connect between the first integrated circuit die 308 and a first top side 316 of the first substrate 310. External interconnects 318 attach on a first bottom side 320 of the first substrate 310 for connections to the next system level (not shown), such as printed circuit board.

The first substrate 310 has a first top metal layer 322, a first middle metal layer 324, and a first bottom metal layer 326 with first electrical vias 328 connecting these layers at predetermined locations and configurations. The external interconnects 318 attach to the first bottom metal layer 326. The first interconnects 314 attach to the first top metal layer 322. The first top metal layer 322, the first middle metal layer 324, and the first bottom metal layer 326 may be used for signal routing throughout the first substrate 310. The first substrate 310 also includes a first insulation 330 providing mechanical support as well as electrically isolating traces in the first top metal layer 322 from each other, traces in the first middle metal layer 324 from each other, traces in the first bottom metal layer 326 from each other as well as the first top metal layer 322, the first middle metal layer 324, and the first bottom metal layer 326 from each other. The first insulation 330 also provides mechanical support and electrically isolates the first electrical vias 328 from each other.

The spacer layer 304 includes first passive components 332, such as pre-packaged resistors, capacitors, or inductors sometimes referred to as 0201, 0402, or 0603. The first passive components 332 serve as spacer structures separating the first stack layer 302 and the second stack layer 306. The first passive components 332 are on the first integrated circuit die 308 without impeding the first interconnects 314 while spaced such that a package encapsulation 334 fills the space between the first passive components 332.

Some or all of the first passive components 332 may be electrically connected to the first integrated circuit die 308. Some or all of the first passive components 332 may also electrically, as well as mechanically, connect to the second stack layer 306. A matrix of interconnects and distribution may be formed with first terminals 364 and second terminals 366, both of the first passive components 332. It is understood that the first passive components 332 may have different number of terminals.

Signals may flow between the second stack layer 306 and itself through the first terminals 364 to the second terminals 366 or vice versa such that the first passive components 332 serves as interconnects and distribution layer for a second substrate 338. The first passive components 332 serving as the distribution layer for the second substrate 338 may be mechanically attached to the first integrated circuit die 308.

Signals may also flow between bond pads (not shown) of the first integrated circuit die 308 through the first terminals 364 to the second terminals 366 or vice versa such that the first passive components 332 serves as interconnects and distribution layer for the first integrated circuit die 308. The first passive components 332 serving as the distribution layer for the first integrated circuit die 308 may be mechanically attached to the second substrate 338.

Signals may further flow between bond pads of the first integrated circuit die 308 and the second substrate 338 through the first terminals 364 to the second terminals 366 or vice versa such that the first passive components 332 serves as interconnects and distribution layer between the first integrated circuit die 308 and the second substrate 338. The first passive components 332 serving as the distribution layer between the first integrated circuit die 308 and the second substrate 338 may be mechanically attached to the second substrate 338 and the first integrated circuit die 308, respectively. For example, the first terminals 364 electrically attach to the second substrate 338 and mechanically attach to the first integrated circuit die 308 while the second terminals 366 mechanically attach to the second substrate 338 and electrically attach to the first integrated circuit die 308, or vice versa.

The first passive components 332 may form various circuits and functions, such as mode selection, voltage dividers, noise filters, high pass filters, or low pass filters. These circuits may provide signal conditioning for signals through the second substrate 338, through the first integrated circuit die 308, or between the first stack layer 302 and the second stack layer 306. Each of the first passive components 332 may form the interconnection or distribution functions as well as serve as a spacer. The first passive components 332 or a portion may also form a circuit network.

The second stack layer 306 stacks on the spacer layer 304 and over the first stack layer 302. The second stack layer 306 includes an integrated circuit package 336, such as a land grid array device or a flip chip, having a second integrated circuit die (not shown) on a third substrate 344 of the integrated circuit package 336 covered with a first encapsulation 340. The integrated circuit package 336 connects to a second top side 342 of the second substrate 338 with second interconnects 346, such as solder bumps or solder balls. Second passive components 348, such as resistors, capacitors, or inductors, also attach to the second top side 342. Third interconnects 350, such as bond wires, connect between the second substrate 338 and the first substrate 310.

The second substrate 338 has a second top metal layer 354, a second middle metal layer 356, and a second bottom metal layer 358 with second electrical vias 360 connecting these layers at predetermined locations and configurations. The first passive components 332 attach to the second bottom metal layer 358. The second interconnects 346 attach to the second top metal layer 354. The second top metal layer 354, the second middle metal layer 356, and the second bottom metal layer 358 may be used for signal routing throughout the second substrate 338 along with the first passive components 332.

The second substrate 338 also includes a second insulation 362 providing mechanical support as well as electrically isolating traces in the second top metal layer 354 from each other, traces in the second middle metal layer 356 from each other, traces in the second bottom metal layer 358 from each other as well as the second top metal layer 354, the second middle metal layer 356, and the second bottom metal layer 358 from each other. The second insulation 362 also provides mechanical support and electrically isolates the second electrical vias 360 from each other.

The package encapsulation 334 covers the first integrated circuit die 308, the first interconnects 314, the first passive components 332, the second stack layer 306, and the third interconnects 350 forming the second stacked integrated circuit package system 300. The first stack layer 302, the first passive components 332, the integrated circuit package 336, and the second stack layer 306 may be tested to ensure known good devices (KGD) prior to assembly of the second stacked integrated circuit package system 300.

For illustrative purpose, the first substrate 310, the second substrate 338, the third substrate 344 are shown as having three layers, although it is understood that the number of metal layers may differ. Also for illustrative purpose, the second stacked integrated circuit package system 300 is shown as having two stack layers, although it is understood that the number of stack layers may differ. Further for illustrative purpose, the spacer layer 304 is shown to have the first passive components 332, although it is understood that the spacer layer 304 may include other spacer structures and device types.

Figure 4:
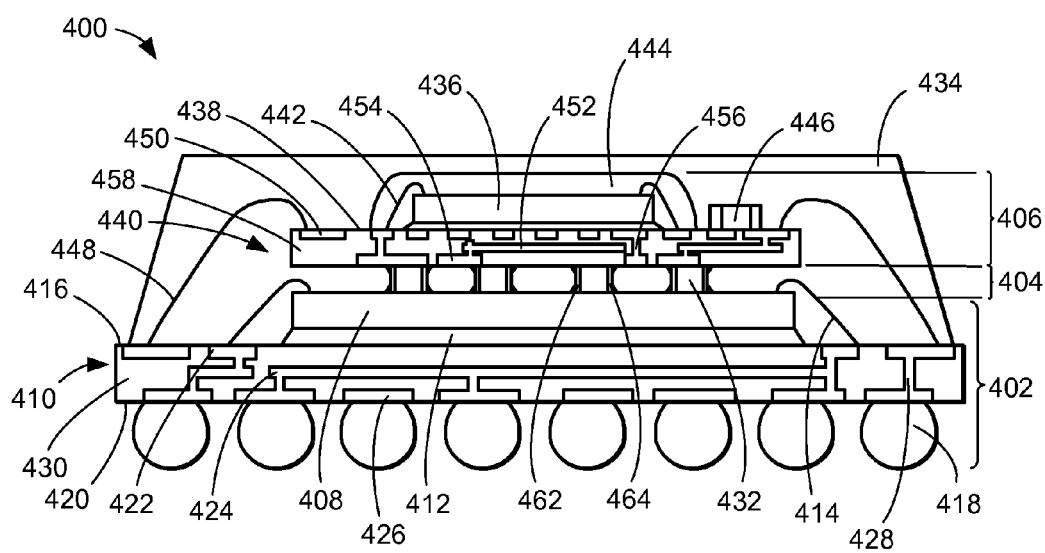
FIG. 4 is a cross-sectional view of a third stacked integrated circuit package system in another alternative embodiment of the present invention.

Referring now to FIG. 4, therein is shown a cross-sectional view of a third stacked integrated circuit package system 400 in another alternative embodiment of the present invention. The third stacked integrated circuit package system 400 includes a first stack layer 402, a spacer layer 404, and a second stack layer 406. The second stack layer 200 of FIG. 2 may represent the second stack layer 406 for the third stacked integrated circuit package system 400.

The first stack layer 402 includes a first integrated circuit die 408 attached to a first substrate 410 with an adhesive 412, such as a die-attach adhesive. First interconnects 414, such as bond wires, connect between the first integrated circuit die 408 and a first top side 416 of the first substrate 410. External interconnects 418 attach on a first bottom side 420 of the first substrate 410 for connections to the next system level (not shown), such as printed circuit board.

The first substrate 410 has a first top metal layer 422, a first middle metal layer 424, and a first bottom metal layer 426 with first electrical vias 428 connecting these layers at predetermined locations and configurations. The external interconnects 418 attach to the first bottom metal layer 426. The first interconnects 414 attach to the first top metal layer 422. The first top metal layer 422, the first middle metal layer 424, and the first bottom metal layer 426 may be used for signal routing throughout the first substrate 410. The first substrate 410 also includes a first insulation 430 providing mechanical support as well as electrically isolating traces in the first top metal layer 422 from each other, traces in the first middle metal layer 424 from each other, traces in the first bottom metal layer 426 from each other as well as the first top metal layer 422, the first middle metal layer 424, and the first bottom metal layer 426 from each other. The first insulation 430 also provides mechanical support and electrically isolates the first electrical vias 428 from each other.

The spacer layer 404 includes first passive components 432, such as pre-packaged resistors, capacitors, or inductors sometimes referred to as 0201, 0402, or 0603. The first passive components 432 serve as spacer structures separating the first stack layer 402 and the second stack layer 406. The first passive components 432 are on the first integrated circuit die 408 without impeding the first interconnects 414 while spaced such that a package encapsulation 434 fills the space between the first passive components 432.

Some or all of the first passive components 432 may be electrically connected to the first integrated circuit die 408. Some or all of the first passive components 432 may also electrically, as well as mechanically, connect to the second stack layer 406. A matrix of interconnects and distribution may be formed with first terminals 462 and second terminals 464, both of the first passive components 432. It is understood that the first passive components 432 may have different number of terminals.

Signals may flow between the second stack layer 406 and itself through the first terminals 462 to the second terminals 464 or vice versa such that the first passive components 432 serves as interconnects and distribution layer for a second substrate 440. The first passive components 432 serving as the distribution layer for the second substrate 440 may be mechanically attached to the first integrated circuit die 408.

Signals may also flow between bond pads (not shown) of the first integrated circuit die 408 through the first terminals 462 to the second terminals 464 or vice versa such that the first passive components 432 serves as interconnects and distribution layer for the first integrated circuit die 408. The first passive components 432 serving as the distribution layer for the first integrated circuit die 408 may be mechanically attached to the second substrate 440.

Signals may further flow between bond pads of the first integrated circuit die 408 and the second substrate 440 through the first terminals 462 to the second terminals 464 or vice versa such that the first passive components 432 serves as interconnects and distribution layer between the first integrated circuit die 408 and the second substrate 440. The first passive components 432 serving as the distribution layer between the first integrated circuit die 408 and the second substrate 440 may be mechanically attached to the second substrate 440 and the first integrated circuit die 408, respectively. For example, the first terminals 462 electrically attach to the second substrate 440 and mechanically attach to the first integrated circuit die 408 while the second terminals 464 mechanically attach to the second substrate 440 and electrically attach to the first integrated circuit die 408, or vice versa.

The first passive components 432 may form various circuits and functions, such as mode selection, voltage dividers, noise filters, high pass filters, or low pass filters. These circuits may provide signal conditioning for signals through the second substrate 440, through the first integrated circuit die 408, or between the first stack layer 402 and the second stack layer 406. Each of the first passive components 432 may form the interconnection or distribution functions as well as serve as a spacer. The first passive components 432 or a portion may also form a circuit network.

The second stack layer 406 stacks on the spacer layer 404 and over the first stack layer 402. The second stack layer 406 includes a second integrated circuit die 436 connected to a second top side 438 of the second substrate 440 with second interconnects 442, such as bond wires. The second integrated circuit die 436 and the second interconnects 442 are covered by a first encapsulation 444, such as a glob top or mold encapsulation. Second passive components 446, such as resistors, capacitors, or inductors, also attach to the second top side 438. Third interconnects 448, such as bond wires, connect between the second substrate 440 and the first substrate 410.

The second substrate 440 has a second top metal layer 450, a second middle metal layer 452, and a second bottom metal layer 454 with second electrical vias 456 connecting these layers at predetermined locations and configurations. The first passive components 432 attach to the second bottom metal layer 454. The second interconnects 442 attach to the second top metal layer 450. The second top metal layer 450, the second middle metal layer 452, and the second bottom metal layer 454 may be used for signal routing throughout the second substrate 440 along with the first passive components 432.

The second substrate 440 also includes a second insulation 458 providing mechanical support as well as electrically isolating traces in the second top metal layer 450 from each other, traces in the second middle metal layer 452 from each other, traces in the second bottom metal layer 454 from each other as well as the second top metal layer 450, the second middle metal layer 452, and the second bottom metal layer 454 from each other. The second insulation 458 also provides mechanical support and electrically isolates the second electrical vias 456 from each other.

The package encapsulation 434 covers the first integrated circuit die 408, the first interconnects 414, the first passive components 432, the second stack layer 406, and the third interconnects 448 forming the third stacked integrated circuit package system 400. The first stack layer 402, the first passive components 432, and the second stack layer 406 may be tested to ensure known good devices (KGD) prior to assembly of the third stacked integrated circuit package system 400.

For illustrative purpose, the first substrate 410 and the second substrate 440 are shown as having three layers, although it is understood that the number of metal layers may differ. Also for illustrative purpose, the second stacked integrated circuit package system 300 is shown as having two stack layers, although it is understood that the number of stack layers may differ. Further for illustrative purpose, the spacer layer 404 is shown to have the first passive components 432, although it is understood that the spacer layer 404 may include other spacer structures and device types.

Figure 5:
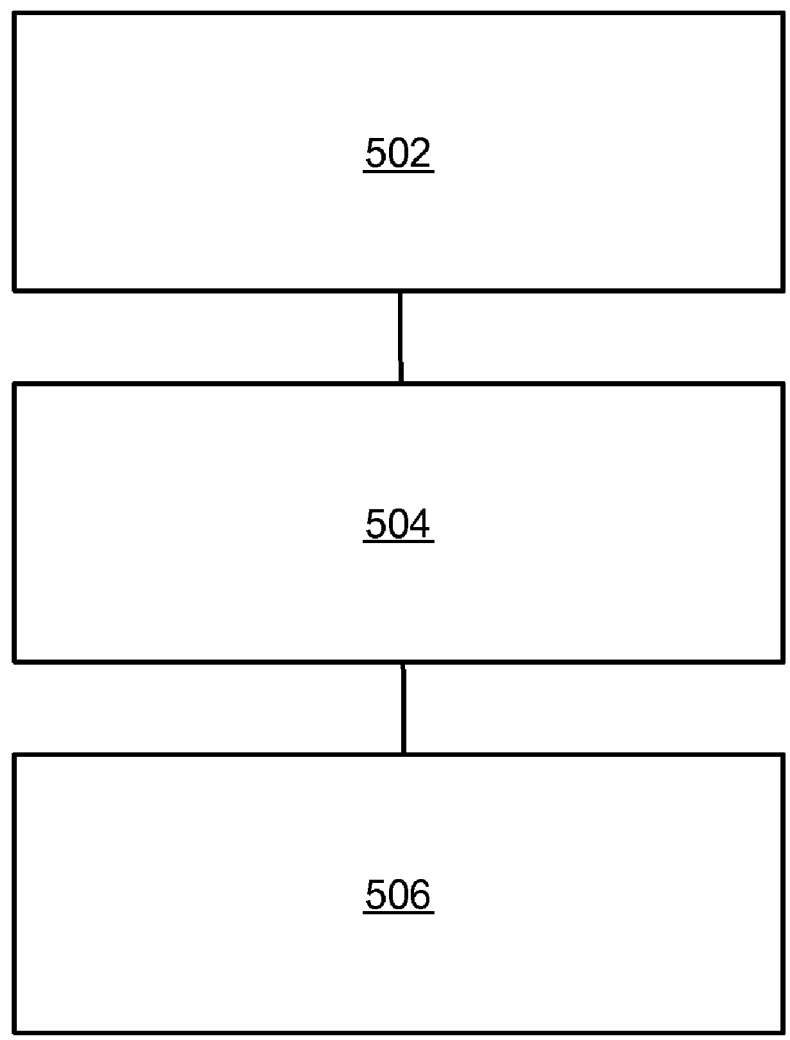
FIG. 5 is a flow chart of a stacked integrated circuit package system for the stacked integrated circuit package system in an embodiment of the present invention.

Referring now to FIG. 5, therein is shown a flow chart of a stacked integrated circuit package system 500 for the stacked integrated circuit package system 100 in an embodiment of the present invention. The system 500 includes forming a first stack layer having a first integrated circuit die on a first substrate in a block 502; forming a second stack layer having a second integrated circuit die on a second substrate in a block 504; and mechanically and electrically connecting a spacer layer having a first passive component between the second stack layer and the first stack layer in a block 506.

It has been discovered that the present invention thus has numerous aspects.

It has been discovered that the present invention provides mixed signal functions with integration of discrete analog passive components, such as component numbers 0201, 0402, or 0603, while providing the flexible stacking options with the passive components potentially serving as a spacer structure and interconnect structure between the stacked layers.

An aspect is that the present invention is the passive component serving as a spacer for stacking and/or interconnects between first layer circuits, such as a first stack layer, to a second layer circuit, such as a second stack layer. The passive components are placed on top of die of the first layer circuits creating a gap between the two layer circuits. Multiple packages can be attached on top of the second layer substrate making it flexible for stacking variety of packages.

Another aspect of the present invention is that the passive component can be active part of the first layer circuitry and/or electrically connected to the second layer circuitry while acting as a spacer. Flexible stacking options are then possible by attaching "Known Good Package" such as passive components, land grid array (LGA) devices, flip chips, or wire bonded packages, in the second layer substrate.

Yet another aspect of the present invention is that the passive components may form a matrix of connections providing signal conduction paths for the first circuit layer, the second circuit layer, and between the first circuit layer and the second circuit layer. The signal distribution or redistribution may be to signals within the integrated circuit die of the first circuit layer or the integrated circuit die may have a separate redistribution layer in the post-passivation stack for redistribution of signals not involving the circuitry of the integrated circuit die.

Thus, it has been discovered that the stacked integrated circuit package system method of the present invention furnishes important and heretofore unknown and unavailable solutions, capabilities, and functional aspects for increasing chip density with mixed-signal integration in systems while simplifying manufacturing process. The resulting processes and configurations are straightforward, cost-effective, uncomplicated, highly versatile and effective, can be implemented by adapting known technologies, and are thus readily suited for efficiently and economically manufacturing stacked integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto for set forth herein or shown in the accompanying drawings are to be interpreted in an illustrative and non-limiting sense.

The invention claimed is:

1. A method of manufacture of a stacked integrated circuit package system comprising:
  forming a first stack layer having a first integrated circuit die on a first substrate;
  forming a second stack layer having a second integrated circuit die on a second substrate; and
  connecting a first passive component for providing a direct mechanical connection between the second substrate and the first integrated circuit die, wherein the first passive component is in a package having a predetermined thickness to separate the second stack layer and the first stack layer by the predetermined thickness.

2. The method as claimed in claim 1 wherein connecting the first passive component comprises:
  forming the first passive component having a first terminal and a second terminal; and
  forming a matrix of electrical connections with the first terminal and the second terminal between the first stack layer and the second stack layer, both electrically connected to the first stack layer, or both electrically connected to the second stack layer.

3. The method as claimed in claim 1 further comprising forming a circuit network with a plurality of first passive components for the first stack layer.

4. The method The system as claimed in claim 1 further comprising forming a circuit network with a plurality of first passive components for the second stack layer.

5. The method as claimed in claim 1 further comprising forming a circuit network with a plurality of first passive components between the first stack layer and the second stack layer.

6. A method of manufacture of a stacked integrated circuit package system comprising:
- forming a first stack layer having a first integrated circuit die on a first substrate;
- forming a second stack layer having a second integrated circuit die on a second substrate;
- connecting a first passive component for providing a direct mechanical connection between the second substrate and the first integrated circuit die, wherein the first passive component is in a package having a predetermined thickness to separate the second stack layer and the first stack layer by the predetermined thickness;
- electrically connecting the first integrated circuit die and the first substrate; and
- electrically connecting the second substrate and the first substrate.

7. The method as claimed in claim 6 wherein forming the second stack layer includes mounting a third integrated circuit die and a second passive component on the second substrate.

8. The method as claimed in claim 6 wherein forming the second stack layer includes providing the second integrated circuit die packaged in a ball grid array package.

9. The method as claimed in claim 6 wherein forming the second stack layer includes attaching a bond wire between the second integrated circuit die and the second substrate.

10. The method as claimed in claim 6 wherein forming the second stack layer having the second integrated circuit die includes encapsulating the second integrated circuit die.

11. A stacked integrated circuit package system comprising:
- a first stack layer having a first integrated circuit die on a first substrate;
- a second stack layer having a second integrated circuit die on a second substrate; and
- a first passive component for providing a direct mechanical connection between the second substrate and the first integrated circuit die, wherein the first passive component is in a package having a predetermined thickness for separating the second stack layer and the first stack layer by the predetermined thickness.

12. The system as claimed in claim 11 wherein the first passive component comprises:
- the first passive component having a first terminal and a second terminal; and
- a matrix of electrical connections with the first terminal and the second terminal between the first stack layer and the second stack layer, both electrically connected to the first stack layer, or both electrically connected to the second stack layer.

13. The system as claimed in claim 11 further comprising a circuit network with a plurality of first passive components for the first stack layer.

14. The system as claimed in claim 11 further comprising a circuit network with a plurality of first passive components for the second stack layer.

15. The system as claimed in claim 11 further comprising a circuit network with a plurality of first passive components between the first stack layer and the second stack layer.

16. The system as claimed in claim 11 wherein:
- the first stack layer has the first integrated circuit die on the first substrate with a first metal layer;
- the second stack layer has the second integrated circuit die on the second substrate with a second metal layer;
- the first passive component for separating the second stack layer and the first stack layer includes pre-packaged discrete passive components; and further comprising:
- a first interconnect between the first integrated circuit die and the first substrate; and
- a second interconnect between the second substrate and the first substrate.

17. The system as claimed in claim 16 wherein the second stack layer includes a third integrated circuit die and a second passive component on the second substrate.

18. The system as claimed in claim 16 wherein the second stack layer includes the second integrated circuit die packaged in a ball grid array package.

19. The system as claimed in claim 16 wherein the second stack layer includes a bond wire between the second integrated circuit die and the second substrate.

20. The system as claimed in claim 16 wherein the second stack layer having the second integrated circuit die includes a glob top to cover the second integrated circuit die.

* * * * *